(12) United States Patent
Nishikido

(10) Patent No.: US 6,246,285 B1
(45) Date of Patent: Jun. 12, 2001

(54) AGC CIRCUIT BASED ON A PEAK DETECTION SYSTEM

(75) Inventor: Osamu Nishikido, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/514,644

(22) Filed: Feb. 29, 2000

(30) Foreign Application Priority Data

Oct. 18, 1999 (JP) ................................... 11-295305

(51) Int. Cl.[7] ........................................................ H03G 5/16
(52) U.S. Cl. ........................................... 330/132; 330/279
(58) Field of Search .................................... 330/129, 132, 330/141, 279, 281

(56) References Cited

U.S. PATENT DOCUMENTS

| | | | |
|---|---|---|---|
| 5,128,629 | * 7/1992 | Trinh | 330/129 |
| 5,179,353 | * 1/1993 | Miyake | 330/129 |
| 5,854,971 | * 12/1998 | Nagoya et al. | 455/126 |

FOREIGN PATENT DOCUMENTS

| | | |
|---|---|---|
| 57-186815 | 11/1982 | (JP) . |
| 59-128806 | 7/1984 | (JP) . |
| 63-63208 | 3/1988 | (JP) . |
| 5-199137 | 8/1993 | (JP) . |
| 7-245539 | 9/1995 | (JP) . |
| 10-32443 | 2/1998 | (JP) . |
| 10-270961 | 10/1998 | (JP) . |

* cited by examiner

*Primary Examiner*—Robert Pascal
*Assistant Examiner*—Henry Choe
(74) *Attorney, Agent, or Firm*—Leydig, Voit & Mayer, Ltd.

(57) ABSTRACT

In an automatic gain control (AGC) circuit based on a peak detection system having two filters, a voltage comparator selects one of two voltages and compares the selected voltage with a detection signal output from a wave detector. A second AGC filter selects a cut-off frequency based on the result of comparison of the voltage comparator and supplies a signal resulting from low-pass filtering, based on the selected cut-off frequency, to a voltage-controlled amplifier as a control voltage. When a highly modulated signal is abruptly input, selection of the cut-off frequency of the second AGC filter occurs.

10 Claims, 12 Drawing Sheets

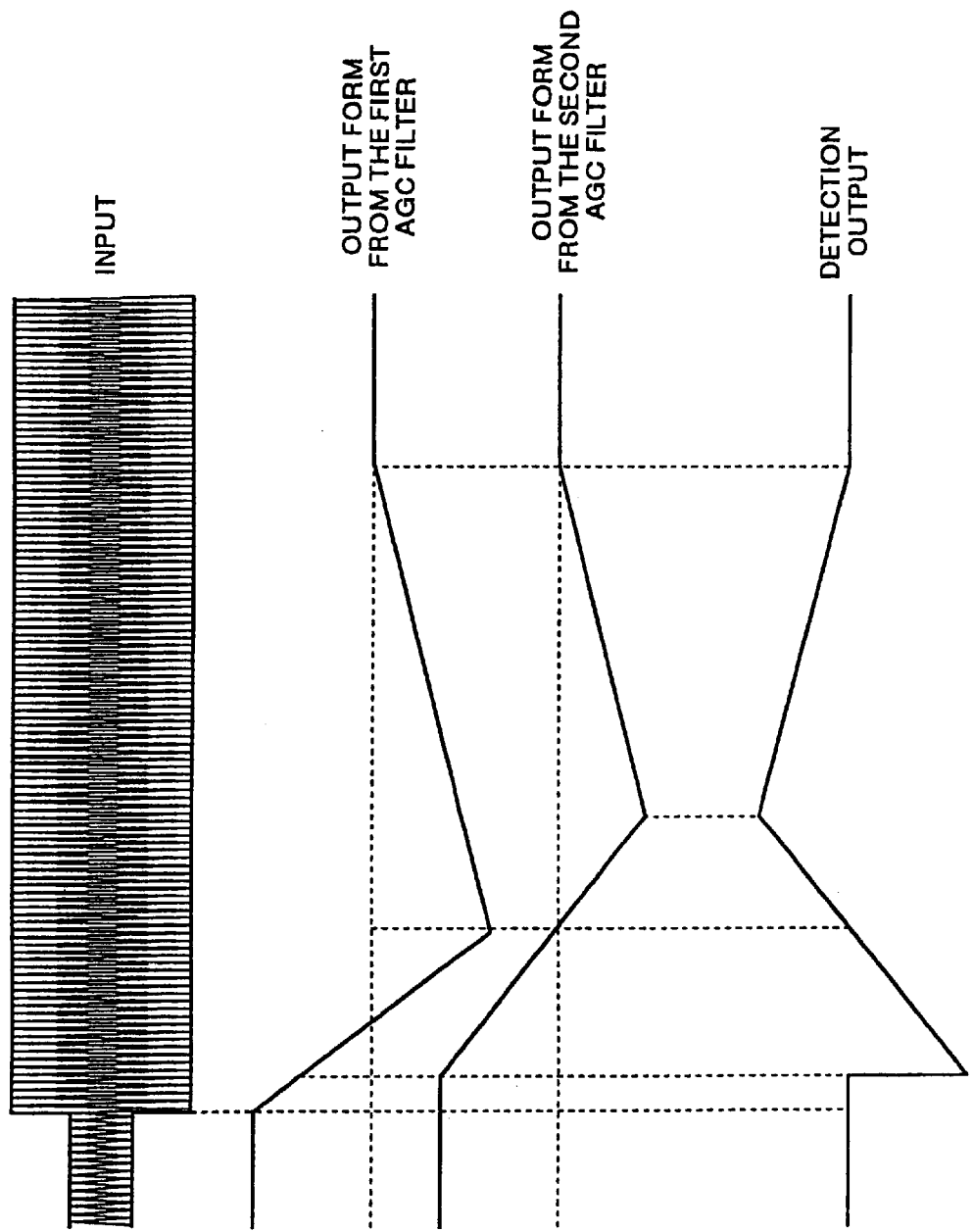

AGC CIRCUIT BASED ON A PEAK DETECTION SYSTEM

FIELD OF THE INVENTION

The present invention relates to an AGC (Automatic Gain Control) circuit based on a peak detection system used for a television receiver or the like. More particularly, this invention relates to a circuit for enabling stable automatic gain control for abrupt fluctuations in amplitude of a modulated signal.

BACKGROUND OF THE INVENTION

FIG. 8 is a block diagram showing an example of a conventional AGC circuit based on a peak detection system. Especially, the AGC circuit based on a peak detection system shown in FIG. 8 is an example of an AGC circuit based on a lower-side peak detection system with single AGC filter, which is used for processing of a VIF signal in a conventional television.

In FIG. 8, the conventional AGC circuit based on a peak detection system comprises a voltage-controlled amplifier 1, a wave detector 2, a voltage comparator 3, and an AGC filter 501. The voltage-controlled amplifier 1 is a circuit which makes it possible to change a gain of an amplifier by a control voltage and amplify an inputted modulated signal with the gain, in which a gain is set to be larger especially when inputted control voltage is higher.

The wave detector 2 is a circuit which demodulates a modulated signal outputted from the voltage-controlled amplifier 1 and outputs a lower-side envelope of the inputted modulated signal as a detection output. The voltage comparator 3 is a circuit which receives a detection output from the wave detector 2 and compares a voltage indicated by the inputted detection output to a prespecified comparison voltage Vc.

The voltage comparator 3 outputs, when the detection output is higher than the comparison voltage Vc as the result of comparison, a logic level signal "H" and outputs a logic level signal "L" when the detection output is lower than the comparison voltage Vc. The comparison voltage Vc is set to be lower than a DC voltage of a detection output in order to detect lower-side peaks.

The AGC filter 501 comprises a switch 4, a constant current source 5, a constant current source 6, and a capacitor 7. The logic level signal outputted from the voltage comparator 3 as the result of comparison is inputted into the AGC filter 501 as a control signal for the switch 4.

The switch 4 selects either one of the constant current source 5 and constant current source 6 based on the signal indicating the above-described result of comparison and connects the selected one to the capacitor 7. More specifically, as shown in FIG. 8, one edge of the capacitor 7 is grounded and the other edge thereof is connected to either one of the constant current source 5 and the constant current source 6. Assuming that the signal showing the above-described result of comparison is a signal A, when the signal A has the logic level "H", the other edge of the capacitor 7 is connected to the constant current source 5 which contributes to current-feed to the capacitor 7, and when the signal A has the logic level "L", the other edge of the capacitor 7 is connected to the constant current source 6 which contributes to drawing in current from the capacitor 7.

In other words, when the detection output is higher than the comparison voltage Vc, the capacitor 7 is recharged by the constant current source 5, and the capacitor 7 is discharged by the constant current source 6 when the detection output is lower than the comparison voltage Vc.

A change in a voltage due to recharging or discharging of the capacitor 7 is inputted into the voltage-controlled amplifier 1 as a control voltage to enable controlling of a gain of the voltage-controlled amplifier 1, and a negative-feedback loop is formed in the entire AGC circuit thereby.

In this process, a charging current by the constant current source 5 is fixed smaller and a discharging current by the constant current source 6 is fixed larger. With this fixation, when a detection output is lower than a comparison voltage, the gain of the voltage-controlled amplifier 1 is quickly decreased to operate so that the detection output becomes Vc. On the other hand, when the detection output is higher than the comparison voltage, the gain of the voltage-controlled amplifier 1 hardly changes, and the lower-side peak detection becomes possible.

The AGC circuit based on a lower-side peak detection system is formed by the negative-feedback loop as described above. Because of this configuration, a lower-side peak potential of the detection output converges to be coincident with the comparison voltage Vc of the voltage comparator 3.

However, when it is tried to quicken the operation speed of the AGC circuit by increasing a speed in recharging or discharging the capacitor 7, the gain is largely changed even if the recharging or discharging is performed for a short period of time. Therefore, as shown in FIG. 9, inclination of output amplitude, what is called a sag, to an ideal output waveform appears remarkably with respect to an actual output waveform and the voltage of the AGC filter.

An AGC circuit obtained by further adding an AGC filter to the AGC circuit shown in FIG. 8 has been known as a means for preventing occurrence of the sag. FIG. 10 is a block diagram showing an example of another conventional AGC circuit based on a peak detection system. Same reference numerals are provided to the sections in FIG. 10 that perform the same functions as the sections shown in FIG. 8, and to avoid repetition, their explanation is omitted.

The AGC circuit based on a peak detection system shown in FIG. 10 comprises, in addition to the above-described AGC filter (first AGC filter in the figure) 501, a buffer 8, and a second AGC filter 502, and output from the second AGC filter 502 is inputted into the voltage-controlled amplifier 1 as a control voltage.

The buffer 8 inputs a voltage received by the first AGC filter 501 into the second AGC filter 502 as it is, and is formed for targeting mainly impedance conversion. The second AGC filter 502 forms a low-pass filter with a resistor 9 and a capacitor 10 provided therein. A voltage outputted from the first AGC filter is inputted to the resistor 9 via the buffer 8.

Because a high-frequency component is removed from the control voltage outputted from the second AGC filter 502 by a function of low-pass filtering, the control voltage smoothly fluctuates. In accordance with the smooth fluctuation of the control voltage, the gain of the voltage-controlled amplifier 1 is also smoothly changed. Therefore, the above-described sag can be made gradual.

As described above, with the conventional AGC circuit based on a peak detection system shown in FIG. 10, it is possible to make rapid an AGC operation speed and also to suppress occurrence of sag. Although this example shows the system using the buffer 8, a control voltage can directly be inputted into the second AGC filter 502 without the buffer 8 as well, and in this case, the same features can also be obtained.

In the conventional AGC circuit based on a peak detection system, however, there may occur inconvenience because the operation speed is different between the first AGC filter and the second AGC filter. FIG. 11 and FIG. 12 show a relation between input and output when the conventional AGC circuit based on a peak detection system is used, and they are figure to explain the inconvenience mentioned above.

When an amplitude of a modulated signal inputted into the voltage-controlled amplifier 1 becomes sharply small, as the capacitor 7 of the first AGC filter 501 is charged with a small amount of current, an output voltage increases gently, thus a high-frequency component is hardly included in the output voltage.

Therefore, the second AGC filter 502 inputs the output voltage from the first AGC filter 501 into the voltage-controlled amplifier 1 as a control voltage almost as it is, thus an ideal detection output can be obtained even when an amplitude of a modulated signal abruptly decreases as shown in FIG. 11.

On the contrary, when a largely modulated signal is suddenly inputted, a large amount of current is discharged from the first AGC filter 501, so that the output voltage sharply changes rapidly. Accordingly, a large amount of high-frequency component is included in the output voltage, and this high-frequency component is then removed therefrom by the second AGC filter. When amplitude of a modulated signal sharply increases, an overshoot of the detection output is caused for the ideal detection output as shown in the figure.

Since the high-frequency component is removed from the output voltage by the second AGC filter and a delay occurs thereby, there may occur a case where, even when the output voltage from the first AGC filter 501 has reached a desired voltage, an output voltage from the second AGC filter 502 has not yet reached the voltage. Namely, the gain of the voltage-controlled amplifier 1 has not decreased sufficiently enough, so that the first AGC filter 501 keeps on discharging as it is. As the result, overshooting of the detection output, namely excess of the AGC operation occurs, occurs as shown in FIG. 11.

The cause of the excess includes a large amount of discharging current from the first AGC filter 501 and existence of a comparatively large delay because the second AGC filter 502 has a low cut-off frequency as shown in FIG. 12.

SUMMARY OF THE INVENTION

The present invention has been achieved in light of the problems described above. It is an object of the present invention to obtain an AGC circuit based on a peak detection system which is not affected by fluctuations in input amplitudes without loss of characteristics of the conventional AGC operation.

According to one aspect of the present invention, an AGC circuit based on a peak detection system having two filters comprises a second voltage comparator which selects one of a first voltage and a second voltage as a comparison voltage based on the result of its comparison and compares the comparison voltage to a detection signal outputted from a wave detector. The AGC circuit also comprises a second filter which is located in the next stage from a first filter and selects a cut-off frequency based on the result of comparison of the second voltage comparator and inputs the result obtained by subjecting the signal to low-pass filtering based on the cut-off frequency into a voltage-controlled amplifier as a control voltage. Therefore, when a largely modulated signal is abruptly inputted, selection of a cut-off frequency of the second filter is performed so that the cut-off frequency becomes high, which allows an AGC control speed to be increased.

According to another aspect of the present invention, an AGC circuit based on a peak detection system having two filters comprises a first voltage comparator which selects one of a first voltage and a second voltage as a comparison voltage based on the result of its comparison and compares the comparison voltage to a detection signal outputted from a wave detector. The AGC circuit also comprises a first filter which is located in the upstream stage from a second filter and increases or decreases an output voltage based on the result of comparison of the first voltage comparator as well as the result of comparison of the second voltage comparator. Therefore, when a largely modulated signal is abruptly inputted, by increasing or decreasing output voltage from the first filter so that a speed of its changing decreases, the second filter can sufficiently follow fluctuations in output signals from the first AGC filter.

Further, selection of the cut-off frequency of the second filter is performed through selection of a resistor. Therefore, when a largely modulated signal is abruptly inputted, selection between resistors in the second filter is set so as to select a resistor having a resistance with a cut-off frequency to be high, which allows an AGC control speed to be increased.

Further, selection of a cut-off frequency of the second filter is performed through selection of a capacitor. Therefore, when a largely modulated signal is abruptly inputted, selection between capacitors in the second filter is set so as to select a capacitor having a capacitance with a cut-off frequency to be high, which allows an AGC control speed to be increased.

Further, increasing or decreasing of the output voltage from the first filter is performed through selection of a constant current source. Therefore, when a largely modulated signal is abruptly inputted, by setting selection between constant current sources in the first filter so as to select a constant current source having a driving current with a speed of increasing or decreasing an output voltage to be lower, the second filter can sufficiently follow fluctuations in output voltages from the first AGC filter.

Further, increasing or decreasing of the output voltage from the first filter is performed through selection of a capacitor. Therefore, when a largely modulated signal is abruptly inputted, by setting selection between capacitors in the first filter so as to select a capacitor having a capacitance with a speed of increasing or decreasing an output voltage to be lower, the second filter can sufficiently follow fluctuations in output voltages from the first AGC filter.

Other objects and features of this invention will become apparent from the following description with reference to the accompanying drawings.

BRIEF DESCRIPTION OF THE DRAWINGS

FIG. 12 is an explanatory view showing the problem in the conventional AGC circuit.

DESCRIPTION OF THE PREFERRED EMBODIMENTS

Preferred embodiments of the AGC circuit based on a peak detection system according to the present invention are explained in detail below with reference to the attached drawings. It should be noted that the present invention is not limited to the embodiments. Although all of the descriptions below will assume herein configuration using a buffer between a first AGC filter and a second AGC filter, the same effect is obtained even in a case without the buffer therebetween.

Figure 1:
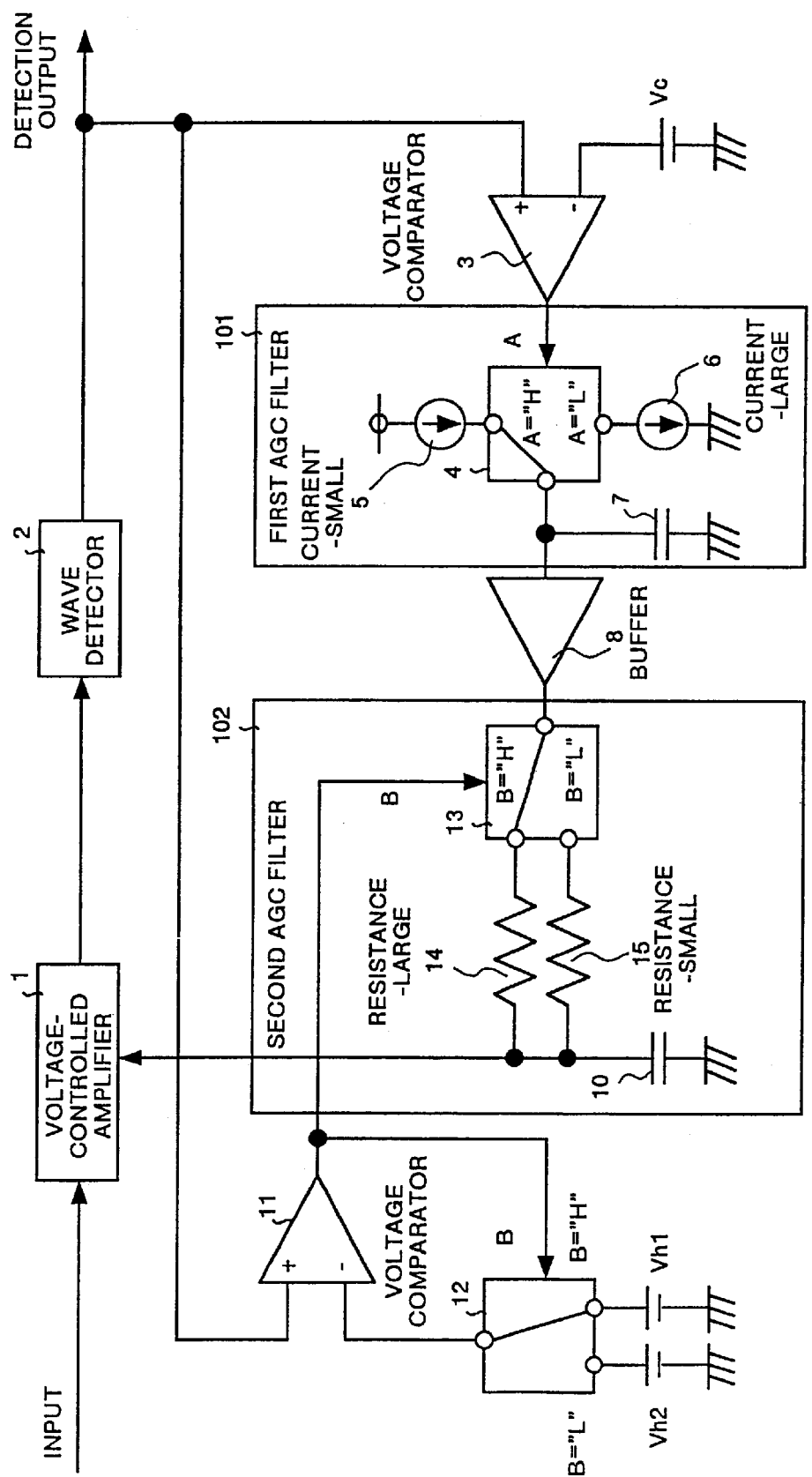
FIG. 1 is a block diagram showing an AGC circuit based on a peak detection system according to a first embodiment of the present invention.

An AGC circuit based on a peak detection system according to a first embodiment of the present invention is explained. FIG. 1 is a block diagram showing the AGC circuit based on a peak detection system according to the first embodiment. Same reference numerals are provided to the sections in FIG. 1 that perform the same functions as the sections shown in FIG. 10, and to avoid repetition, their explanation is omitted.

Figure 10:
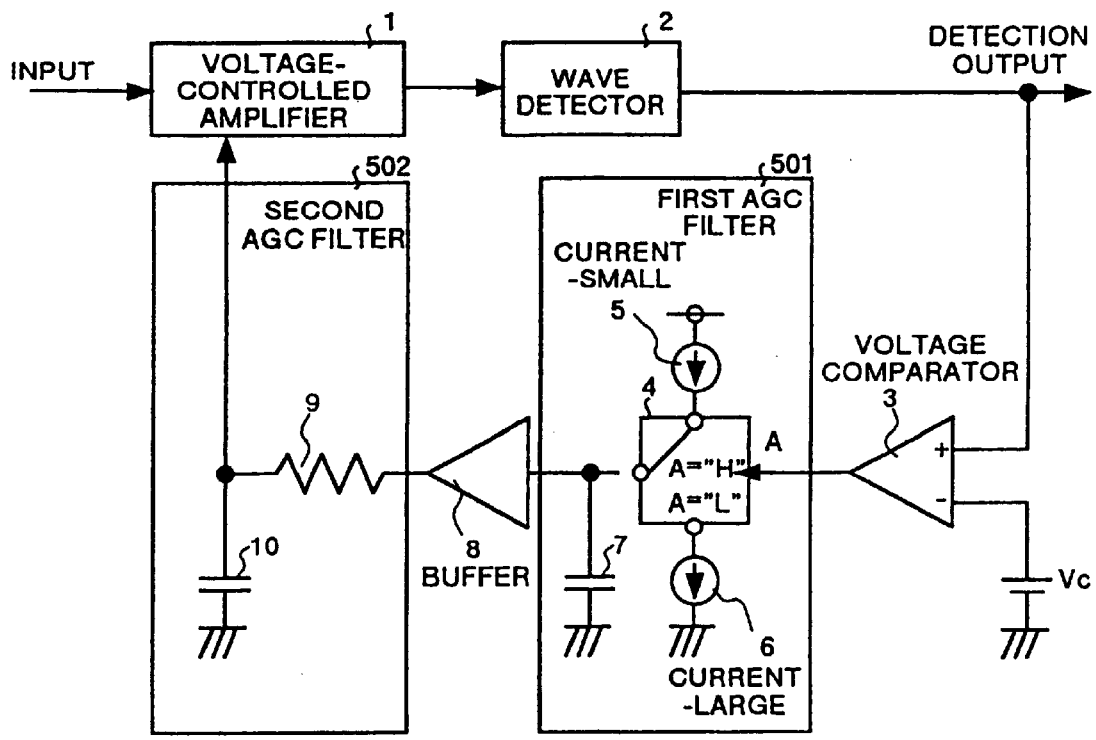
FIG. 10 is a block diagram showing an example of other conventional AGC circuits.
Figure 11:
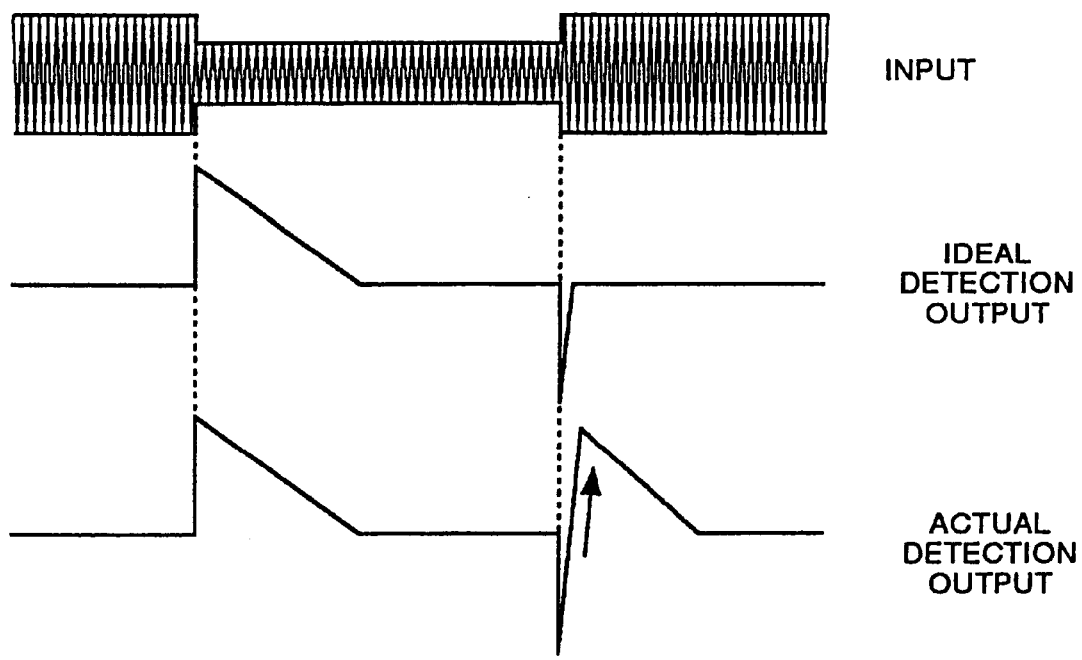
FIG. 11 is an explanatory view showing the problem in the conventional AGC circuit.

The AGC circuit based on a peak detection system shown in FIG. 1 comprises two AGC filters 101 and 102 corresponding to the first AGC filters 501 and 502 shown in FIG. 10, and further a voltage comparator 11 in addition to the voltage comparator 3. Especially, the AGC circuit based on a peak detection system according to the first embodiment is characterized in that a resistor, which determines a cut-off frequency of the second AGC filter 102, is selected based on the result of comparison of the voltage comparator 11.

The second AGC filter 102 functions as a low-pass filter by a cut-off frequency depending on a resistor and a capacitor, similarly to the second AGC filter 502 shown in FIG. 10. This second AGC filter 102 has two resistors (resistors 14 and 15) for determining the cut-off frequency provided therein and a switch 13 for performing selection between those resistors provided therein.

Assuming that a signal showing the result of comparison of the voltage comparator 11 is a signal B, the switch 13 selects the resistor 14 as a resistor contributing to determination of a cut-off frequency when the signal B has the logic level "H". On the other hand, the switch 13 selects the resistor 15 as a resistor contributing to determination of a cut-off frequency when the signal B has the logic level "L". The resistor 14 is set to a resistance in the same level as that of the conventional resistor 9 shown in FIG. 10, while a resistor having a smaller resistance as compared to the resistor 14 is used as the resistor 15.

On the other hand, the voltage comparator 11 is a circuit which receives a detection output from the wave detector 2 and compares a voltage indicated by the received detection output to a prespecified comparison voltage. The voltage comparator 11 outputs a logic level signal "H", when the detection output is higher than the comparison voltage as the result of comparison, and outputs a logic level signal "L" when the detection output is lower than the comparison voltage. However, the comparison voltage is determined by selecting one of the voltages Vh1 and Vh2, and the selection between the comparison voltages is performed by the switch 12 operating in response to the result of comparison of the voltage comparator 11 itself.

The switch 12 selects the voltage Vh1 as a comparison voltage when the signal B showing the result of comparison in the voltage comparator 11 has the logic level "H", and selects the voltage Vh2 as a comparison voltage when the signal B has the logic level "L".

Namely, the voltage comparator 11 has the so-called hysteresis that a threshold voltage used when a signal showing the result of comparison shifts from the logic level "H" to the logic level "L" is different from a threshold voltage used when a signal shifts from the logic level "L" to the logic level "H". The voltage Vh1 is set to a value lower than the comparison voltage Vc of the voltage comparator 3, while the voltage Vh2 is set to a value not less than the comparison voltage Vc.

Operations of the AGC circuit based on a peak detection system will be explained below. The signal processing from the voltage-controlled amplifier 1 to the buffer 8 via the wave detector 2, voltage comparator 3, and first AGC filter 101 is the same as that in the conventional AGC circuit based on a peak detection system. Therefore, explanation is omitted for the operation of these components, and operations of the second AGC filter 102 and the voltage comparator 11 are mainly described herein.

Figure 2:
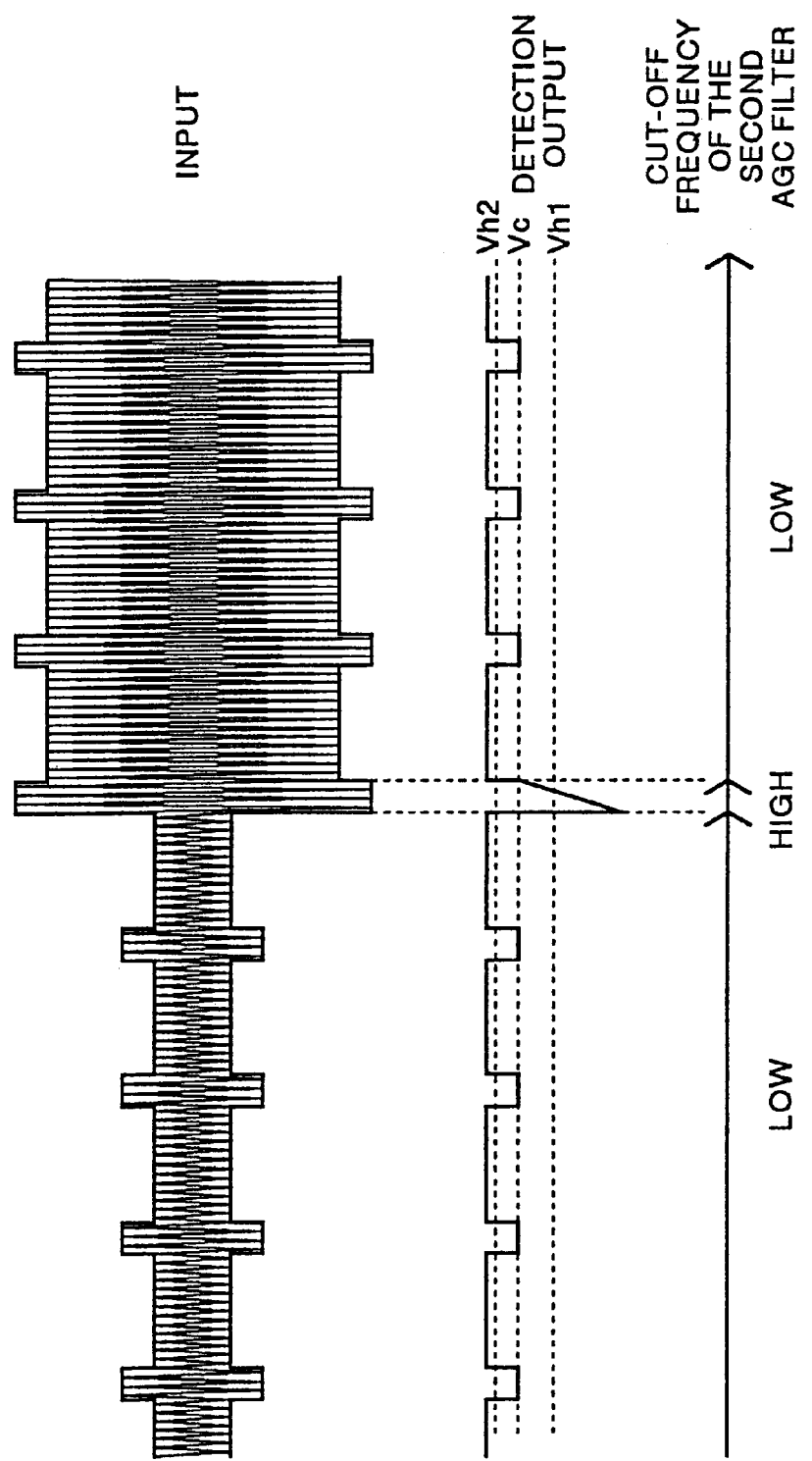
FIG. 2 is an explanatory view showing a relation among a signal inputted into a voltage-controlled amplifier as a modulated signal, a detection output from a wave detector, and a cut-off frequency of a second AGC filter in the AGC circuit based on a peak detection system according to the first embodiment.

FIG. 2 is an explanatory view showing a relation among a signal inputted into the voltage-controlled amplifier 1 as a modulated signal, a detection output from the wave detector 2, and a cut-off frequency of the second AGC filter 102. Output from the voltage comparator 11 in the ordinary state has the logic level "H". With which, the switch 13 selects the resistor 14, and the switch 12 selects the voltage Vh1.

Accordingly, as shown in FIG. 2, the voltage comparator 11 inputs a signal low-pass filtered by a cut-off frequency (areas showing "Low" in the figure) determined by the resistor 14 and the capacitor 10 into the voltage-controlled amplifier 1 as a control voltage. With this operation, a lower-side envelope is detected based on the above-described comparison voltage Vc as a reference potential.

As shown in FIG. 2, when input into the voltage-controlled amplifier 1 suddenly increases and the detection output acquires a value not more than the voltage Vh1, output from the voltage comparator 11 shifts to the logic level "L", and in response to this shift, the switch 12 selects the voltage Vh2 and the switch 13 selects the resistor 15.

The resistor 15 has a smaller resistance than that of the resistor 14. Therefore, a cut-off frequency of the second AGC filter 102 becomes high through selection of the resistor by the switch 13 and a delay developing in the second AGC filter 102 becomes also shorter. Namely, a control speed for the AGC circuit loop becomes quick, so that changes in gains of the voltage-controlled amplifier 1 can sufficiently follow changes in voltages outputted from the first AGC filter 101. Therefore, excess of the AGC operation as seen in the conventional technology is eliminated.

In addition, the comparison voltage of the voltage comparator 11 is switched to Vh2 by the switch 12 in this process. Therefore, a state where excess of the AGC operation is avoided is held until the detection output acquires a value not less than the voltage Vh2. Especially, when input signal is a video signal, a synchronization signal exists at the lowest position of the detection output. Because of this feature, by setting the voltage Vh2 to a value between a pedestal level when the signal is stabilized and a comparison voltage Vc of the voltage comparator 3, the detection output is set to a value not less than the voltage Vh2 by the synchronization signal when the input signal is stabilized unfailingly. Therefore, the output from the voltage comparator 11 is switched to the logic level "H" with the original state returned.

As explained above, with the AGC circuit based on a peak detection system according to the first embodiment of the present invention, the AGC circuit based on a peak detection system having two AGC filters comprises the voltage comparator 11 which selects one of the two voltages Vh1 and Vh2 as a comparison voltage based on the result of its comparison and compares the comparison voltage to a detection signal outputted from the wave detector 2. The AGC circuit also comprises the second AGC filter 102 which is located in the next stage from the first AGC filter 101. The second AGC filter 102 selects one of resistors for determining a cut-off frequency based on the result of comparison of the voltage comparator 11, and inputs the result obtained by subjecting the signal to low-pass filtering based on the cut-off frequency into the voltage-controlled amplifier 1 as a control voltage. Because of this configuration, when a largely modulated signal is abruptly inputted, selection between the resistors in the second AGC filter 102 is performed. Therefore, the cut-off frequency becomes high, which allows an AGC control speed to be quicker and excess of the AGC operation to be suppressed.

In addition, the comparison voltage between voltages Vh1 and Vh2 in the voltage comparator 11 is selected hysteretically in response to abrupt fluctuations in detection signals outputted from the wave detector 2. Therefore, it is possible to rapidly shift the operation to the ordinary operation after the detection signals are stabilized.

Figure 3:
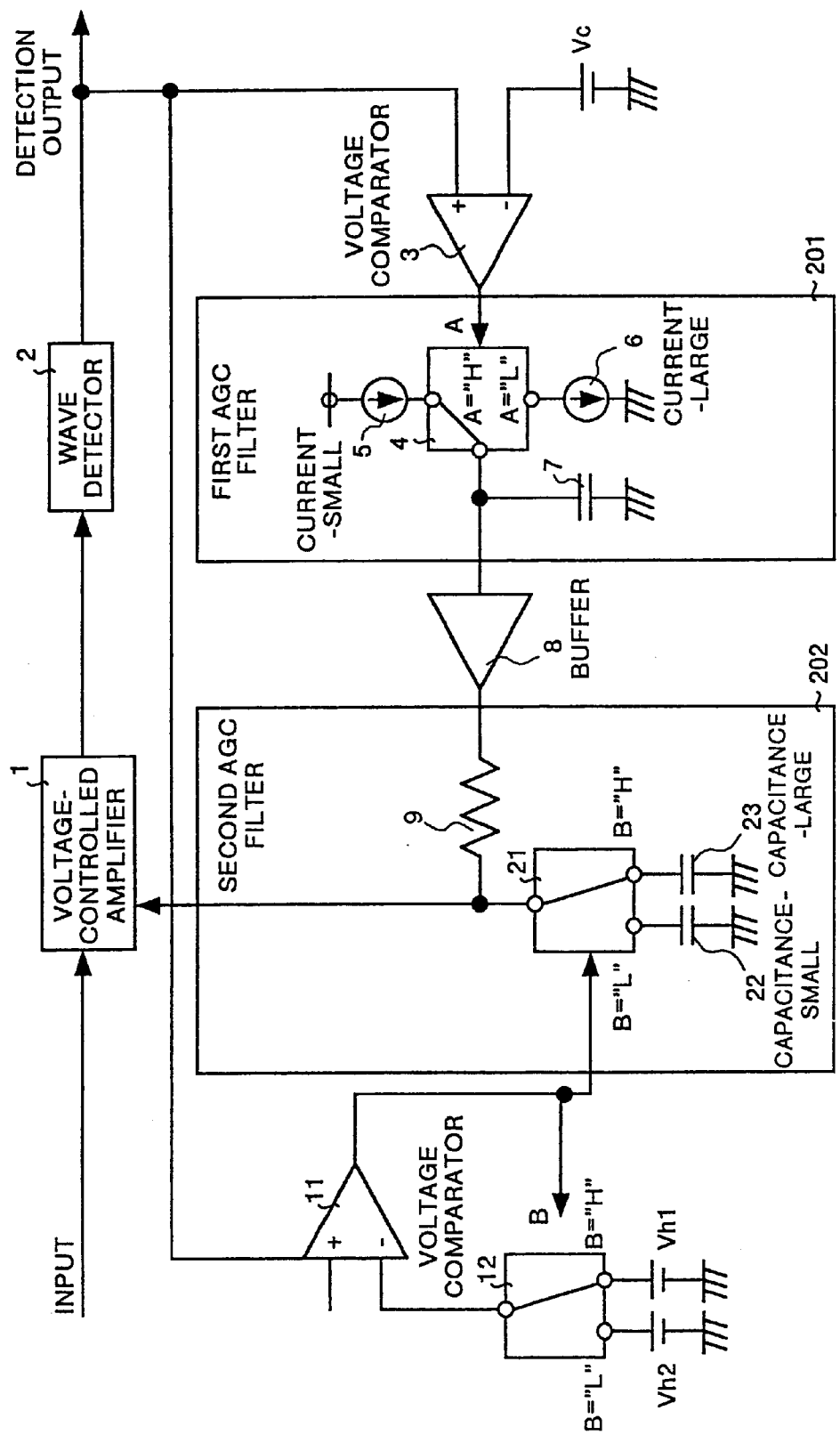
FIG. 3 is a block diagram showing an AGC circuit based on a peak detection system according to a second embodiment.

An AGC circuit based on a peak detection system according to a second embodiment of the present invention is explained below. FIG. 3 is a block diagram showing the AGC circuit based on a peak detection system according to the second embodiment. Same reference numerals are provided to the sections in FIG. 3 that perform the same functions as the sections shown in FIG. 1, and to avoid repetition, their explanation is omitted. A first AGC filter 201 in the figure corresponds to the first AGC filter 101 in FIG. 1.

The AGC circuit based on a peak detection system according to the second embodiment is different from the AGC circuit based on a peak detection system according to the first embodiment in the point that the second AGC filter 202 has two capacitors (capacitors 22 and 23) for determining a cut-off frequency provided therein and a switch 21 controlled by output from the voltage comparator 11 performs selection between the capacitors 22 and 23.

Figure 4:
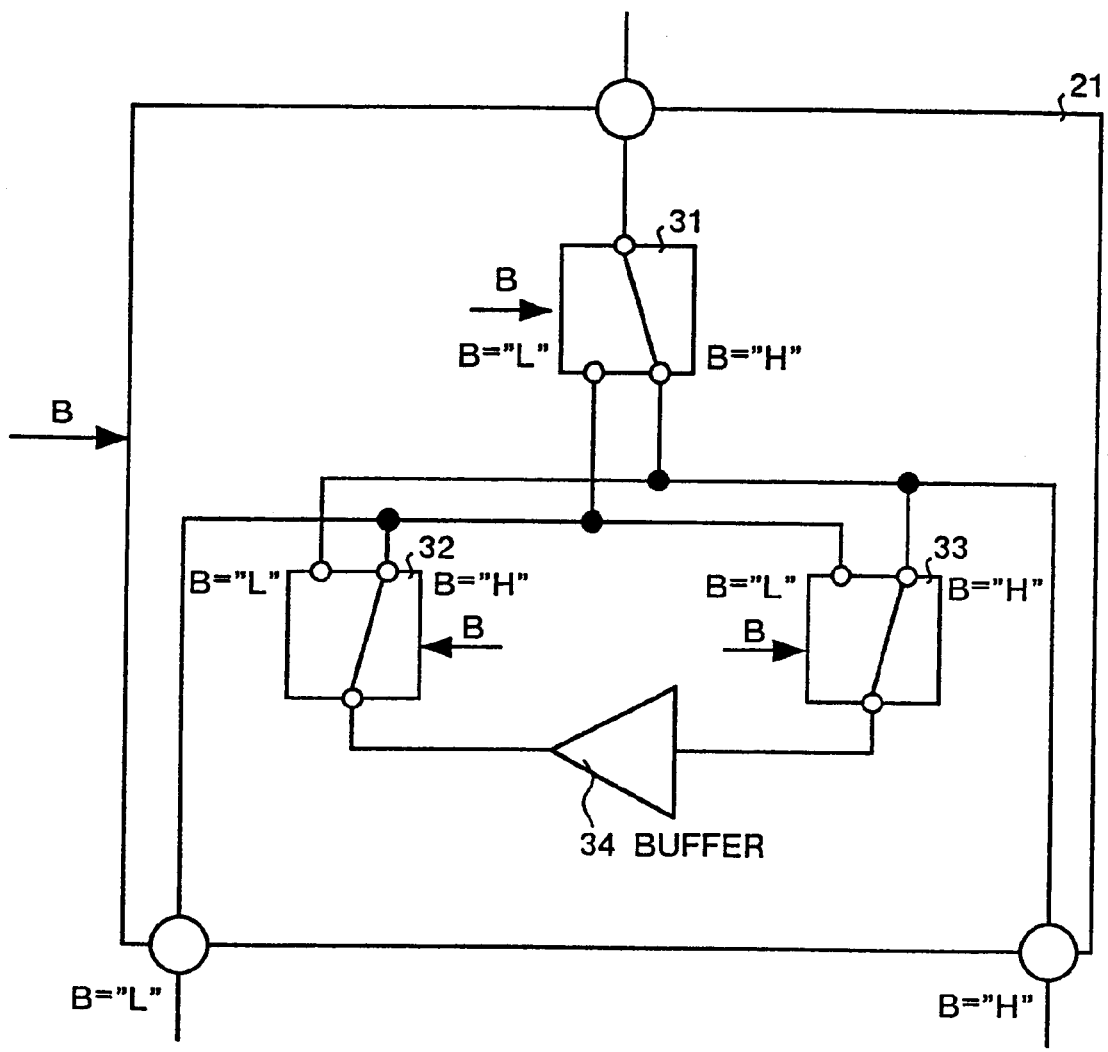
FIG. 4 is a block diagram showing an example of a switch in the AGC circuit based on a peak detection system according to the second embodiment.

However, a particular switch has to be used for the switch 21 so that a voltage does not fluctuate through selection between the capacitors. FIG. 4 is a block diagram showing an example of the switch 21. The switch 21 shown in FIG. 4 further comprises three switches 31 to 33 and a buffer 34. The switch 31 selects one of terminals of the switches 32 and 33 as a terminal to be connected to one end of the resistor 9, and also selects one of terminals to be connected to the capacitors 22 and 23 respectively. Namely, as shown in the figure, two contact terminals each as a target for selection by the switch 31 are connected to one of the contact terminals in each of the switches 32 and 33 respectively, and are also connected to terminals connected to the capacitors 22 and 23 respectively.

One of the two contact terminals in each of the switch 32 and 33 each as a target for selection thereby are connected to the terminal connected to the capacitor 22, and the other contact terminals thereof are connected to the terminal connected to the capacitor 23. The remaining terminals of the switches 32 and 33 are connected to each other via the buffer 34. The buffer 34 outputs input voltage as it is, and with this feature, voltages in both terminals of the switch 32 and 33 are always coincident with each other.

Assuming that the result of comparison outputted from the voltage comparator 11 is a signal B, each of the three switches 31 to 33 performs selection based on the logic level of the signal B as shown in FIG. 4.

Only the different points from the first embodiment on the operation of the AGC circuit based on a peak detection system will be explained below. As explained in the first embodiment, when input into the voltage-controlled amplifier 1 becomes suddenly large and a detection output acquires a value not more than the voltage Vh1, output from the voltage comparator 11 shifts to the logic level "L". In response to the shift, the switch 12 selects the voltage Vh2, and the switch 13 selects the capacitor 22.

As the capacitor 22 has a capacitance which is smaller than that of the capacitor 23, a cut-off frequency of the second AGC filter 202 is set high through selection of the capacitor by the switch 21 and a delay developing in the second AGC filter 202 becomes also shorter. Namely, a control speed for the AGC circuit loop becomes quick, so that changes in gains of the voltage-controlled amplifier 1 can sufficiently follow changes in voltages outputted from the first AGC filter 201. Therefore, excess of the AGC operation as seen in the conventional technology is eliminated.

As described above, with the AGC circuit based on a peak detection system according to the second embodiment, the AGC circuit based on a peak detection system having two AGC filters comprises the voltage comparator 11 which selects one of the two voltages Vh1 and Vh2 as a comparison voltage based on the result of comparison and compares the comparison voltage to a detection signal outputted from the wave detector 2 The AGC circuit also comprises the second AGC filter 202 which is located in the next stage from the first AGC filter 201. The second AGC filter 202 selects one of capacitors for determining a cut-off frequency based on the result of comparison by the voltage comparator 11, and inputs the result obtained by subjecting the signal to low-pass filtering based on the cut-off frequency into the voltage-controlled amplifier 1 as a control voltage. When a largely modulated signal is abruptly inputted, selection between the capacitors in the second AGC filter 202 is performed. Therefore, the cut-off frequency becomes high, which allows an AGC control speed to be quicker and excess of the AGC operation to be suppressed.

In addition, similarly to the first embodiment, the comparison voltage between voltages Vh1 and Vh2 in the voltage comparator 11 is selected hysteretically in response to abrupt fluctuations in detection signals outputted from the wave detector 2. Therefore, it is possible to rapidly shift the operation to the ordinary operation after the detection signals are stabilized.

Figure 5:
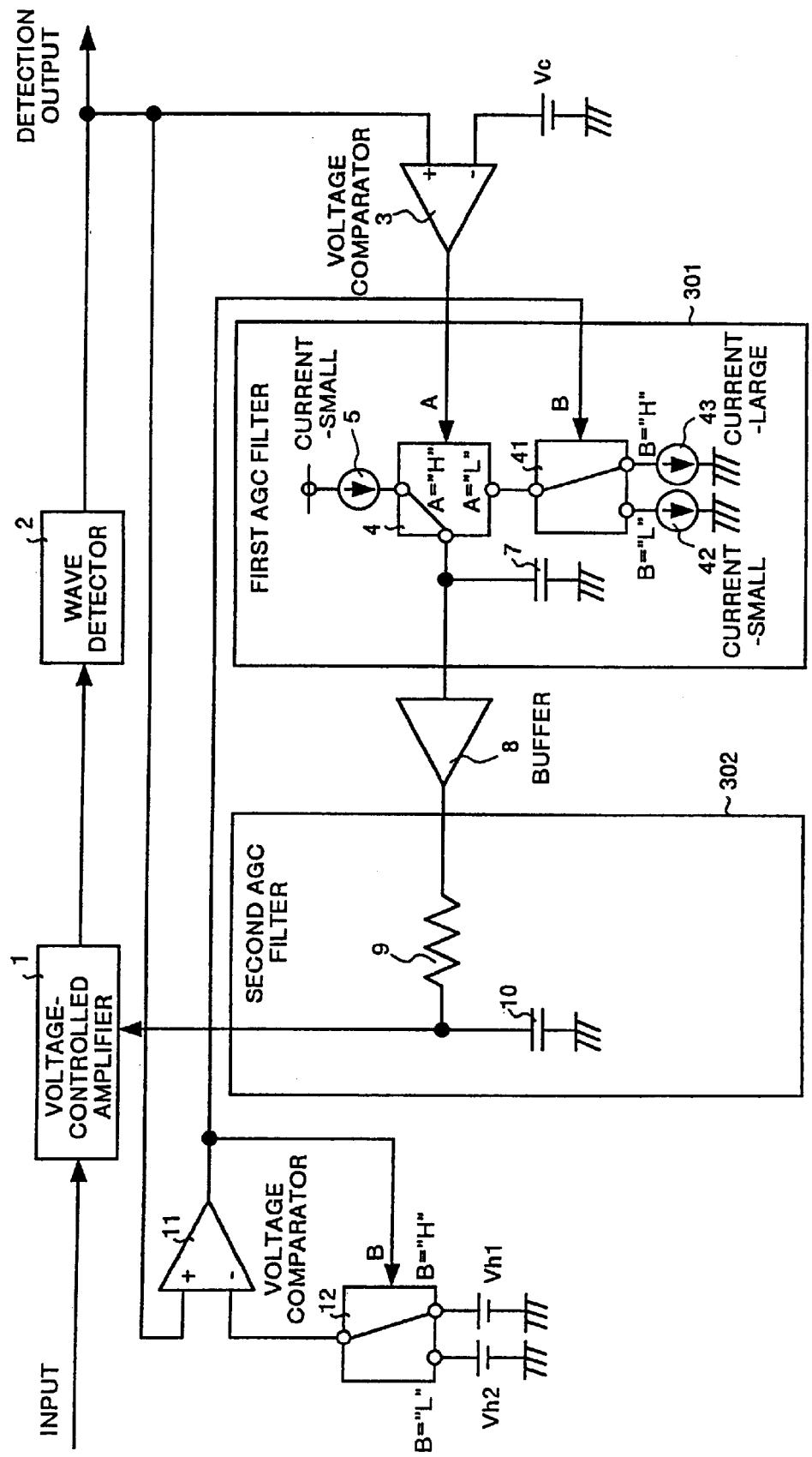
FIG. 5 is a block diagram showing an AGC circuit based on a peak detection system according to a third embodiment.

An AGC circuit based on a peak detection system according to a third embodiment of the present invention is described below. FIG. 5 is a block diagram showing the AGC circuit based on a peak detection system according to the third embodiment. Same reference numerals are provided to the sections in FIG. 5 that perform the same functions as the sections shown in FIG. 10, and to avoid repetition, their explanation is omitted. A second AGC filter 302 in the figure corresponds to the second AGC filter 102.

Especially, the AGC circuit based on a peak detection system according to the third embodiment is characterized in that a first AGC filter 301 selects a constant current source contributing to discharging of a capacitor 7 based on the result of comparison of the voltage comparator 11, while the AGC circuit based on a peak detection system according to the first embodiment selects a cut-off frequency of the second AGC filter 102.

As shown in FIG. 5, the first AGC filter 301, which outputs a voltage increasing or decreasing depending on recharging or discharging of the capacitor with a constant current source similarly to the first AGC filter 501 shown in FIG. 10, has two constant current sources (constant current sources 42 and 43) contributing to discharging of the capacitor, and also has a switch 41 for performing selection between the constant current sources.

Assuming that a signal showing the result of comparison of the voltage comparator 11 is a signal B, the switch 41 selects the constant current source 43 as a constant current source contributing to discharging of the capacitor 7 when the signal B has the logic level "H". On the other hand, the switch 41 and selects the constant current source 42 as a constant current source contributing to discharging of the capacitor 7 when the signal B has the logic level "L". The constant current source 43 is set to a driving current at the same level as that of the conventional constant current source 6 shown in FIG. 10, while a current source providing a constant current which is less than driving current of the constant current source 43 is used as the constant current source 42.

Figure 6:
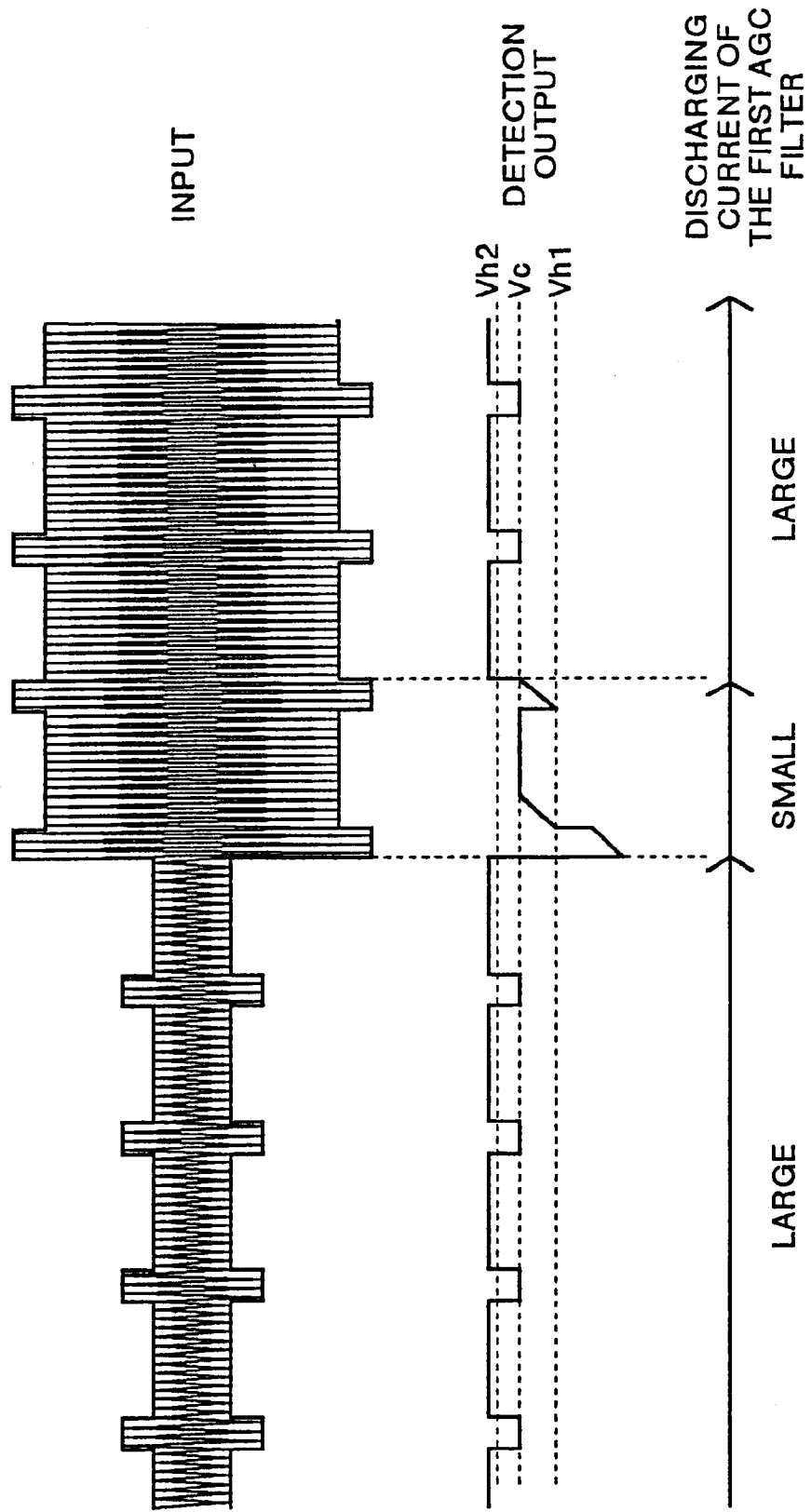
FIG. 6 is an explanatory view showing a relation among a signal inputted into a voltage-controlled amplifier as a modulated signal, a detection output from a wave detector, and a cut-off frequency of a second AGC filter in the AGC circuit based on a peak detection system according to the third embodiment.

Only a different point from the first embodiment on the operation of the AGC circuit based on a peak detection system will mainly be explained below. FIG. 6 is an explanatory view showing a relation between a signal inputted into the voltage-controlled amplifier 1 as a modulated signal, a detection output from the wave detector 2, and a discharging current from the first AGC filter 301. Output from the voltage comparator 11 has the logic level "H" in its normal state, and with this feature, the switch 41 selects the constant current source 43, and the switch 12 selects the voltage Vh1.

Therefore, as shown in FIG. 6, the voltage comparator 11 electrically discharges the capacitor 7 with a driving current (an area indicating "Large" in the figure) shown in the constant current source 43. A voltage dropping by this discharging is inputted into the second AGC filter 302, and a control voltage is inputted into the voltage-controlled amplifier 1. Therefore, a lower-side envelope is detected based on the above-described comparison voltage Vc as a reference potential.

As shown in FIG. 6, when input into the voltage-controlled amplifier 1 becomes abruptly large and detection output is not more than the voltage Vh1, output from the voltage comparator 11 shifts to the logic level "L". In response to the shift, the switch 12 selects the voltage Vh2, and the switch 41 selects the constant current source 42.

As the constant current source 42 has a driving current smaller than that of the constant current source 43, a discharging current to the capacitor 7 becomes smaller by selecting the constant current source by the switch 41. As the result, changes in output voltages from the first AGC filter become smooth, and the second AGC filter 302 can also sufficiently follow the changes. Therefore, excess of the AGC operation as seen in the conventional technology is eliminated.

As described above, with the AGC circuit based on a peak detection system according to the third embodiment, the AGC circuit based on a peak detection system having two AGC filters comprises the voltage comparator 11 which selects one of the two voltages Vh1 and Vh2 as a comparison voltage based on the result of its comparison and compares the comparison voltage to a detection signal outputted from the wave detector 2, and the first AGC filter 301 which selects a constant current source contributing to discharging of the capacitor 7 based on the result of comparison of the voltage comparator 11. When a largely modulated signal is abruptly inputted, selection between constant current sources in the first AGC filter 301 is performed. Therefore, a voltage showing a smooth decrease is outputted, which allows excess of the AGC operation to be suppressed.

In addition, similarly to the first embodiment, the comparison voltage between voltages Vh1 and Vh2 in the voltage comparator 11 is selected hysteretically in response to abrupt fluctuations in detection signals outputted from the wave detector 2. Therefore, it is possible to rapidly shift the operation to the ordinary operation after the detection signals are stabilized.

Figure 7:
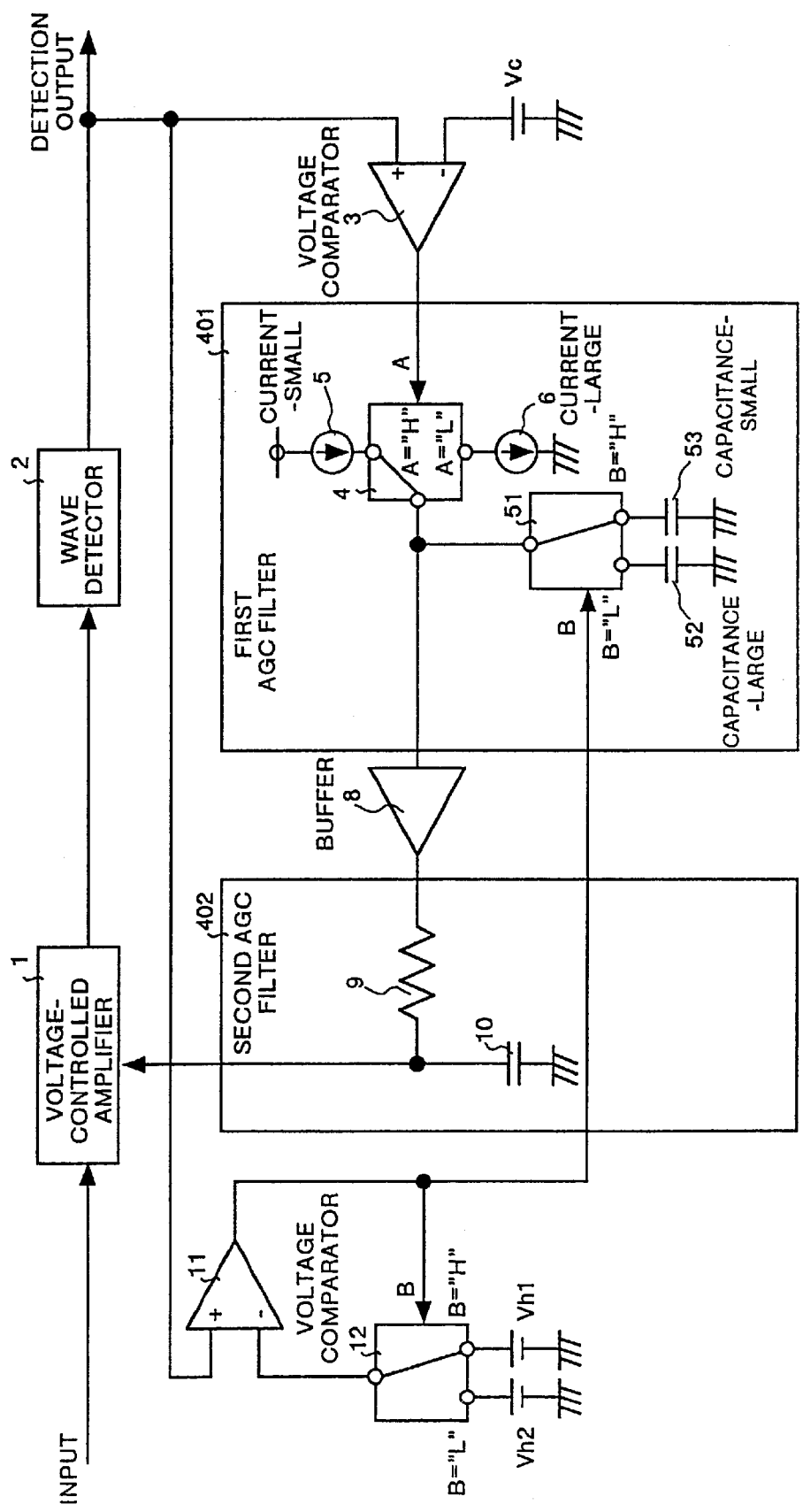
FIG. 7 is a block diagram showing an AGC circuit based on a peak detection system according to a fourth embodiment.
Figure 8:
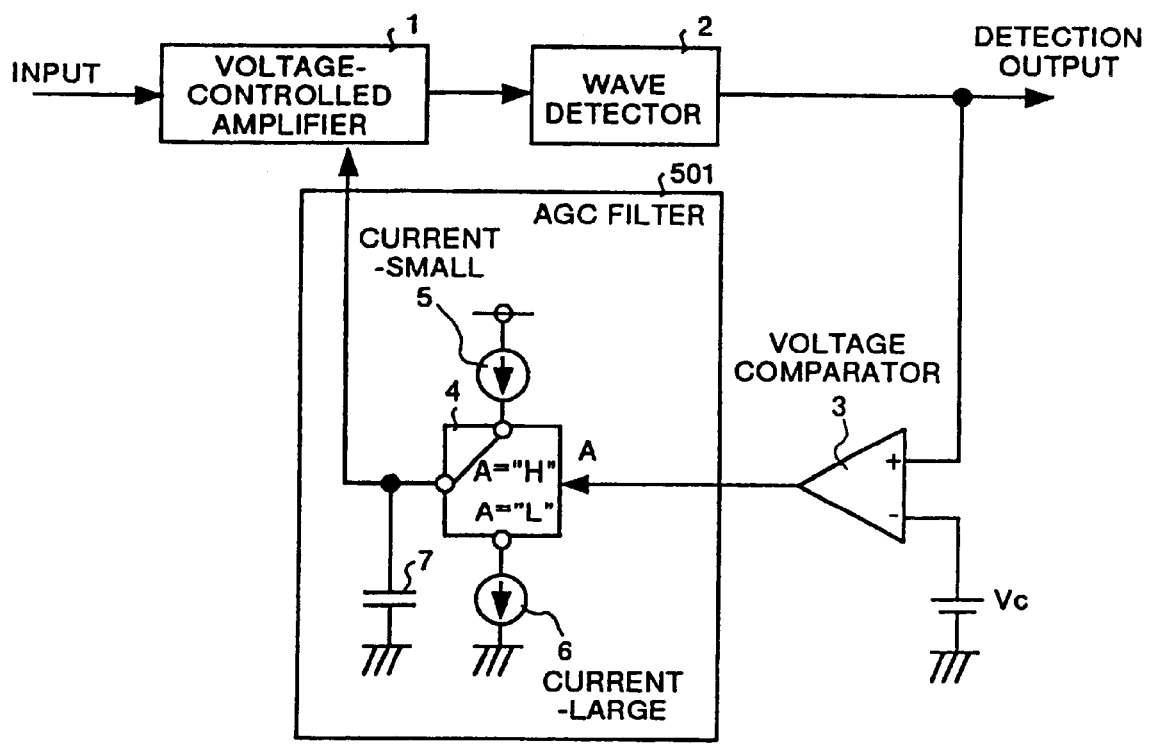
FIG. 8 is a block diagram showing an example of conventional AGC circuits.
Figure 9:
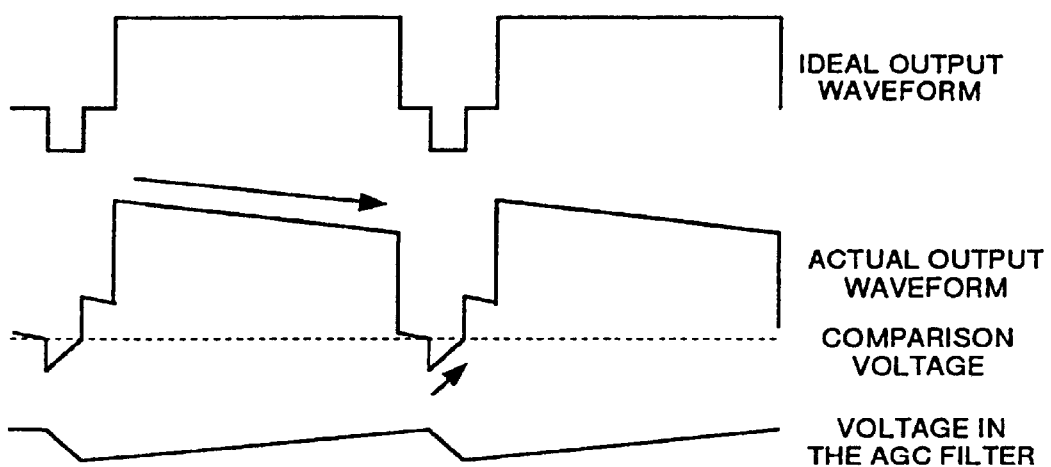
FIG. 9 is an explanatory view showing a problem in the conventional AGC circuit.

An AGC circuit based on a peak detection system according to a fourth embodiment of the present invention is described below. FIG. 7 is a block diagram showing the AGC circuit based on a peak detection system according to the fourth embodiment. Same reference numerals are provided to the sections in FIG. 4 that perform the same functions as the sections shown in FIG. 5, and to avoid repetition, their explanation is omitted. A second AGC filter 402 in the figure corresponds to the second AGC filter 302 shown in FIG. 5.

The AGC circuit based on a peak detection system according to the fourth embodiment is different from the AGC circuit based on a peak detection system according to the third embodiment in the point that two capacitors (capacitors 52 and 53) which are recharged or discharged by a constant current source 5 or 6 are provided in a first AGC filter 401, and a switch 51 controlled according to output from the voltage comparator 11 performs selection between those capacitors 52 and 53.

However, a particular switch similar to the switch 21 described in the second embodiment has to be used for the switch 51 so that a voltage does not fluctuate through selection between the capacitors.

Only the different points from the third embodiment on the operation of the AGC circuit based on a peak detection system are explained below. As described in the third embodiment, when input into the voltage-controlled amplifier 1 becomes suddenly large and detection output acquires a value not more than the voltage Vh1, output from the voltage comparator 11 shifts to the logic level "L". In response to this shift, the switch 12 selects the voltage Vh2 and the switch 51 selects the capacitor 52.

As the capacitor 52 has a capacitance which is larger than that of the capacitor 53, a speed of change in output voltages from the first AGC filter becomes slow through selection of the capacitor by the switch 51. As the result, changes in output voltages from the first AGC filter become smooth, and the second AGC filter 302 can also sufficiently follow the changes. Therefore, excess of the AGC operation as seen in the conventional technology is eliminated.

As described above, with the AGC circuit based on a peak detection system according to the fourth embodiment, the AGC circuit based on a peak detection system having two AGC filters comprises the voltage comparator 11 which selects one of the two voltages Vh1 and Vh2 as a comparison voltage based on the result of its comparison and also compare the comparison voltage to a detection signal outputted from the wave detector 2. The AGC circuit also comprises the first AGC filter 401 which selects a capacitor recharged or discharged with a constant current source based on the result of comparison of the voltage comparator 11. When a largely modulated signal is abruptly inputted, selection between the capacitors in the first AGC filter 401 is performed. Therefore, a voltage showing a smooth decrease is outputted, which allows excess of the AGC operation to be suppressed.

In addition, similarly to the first embodiment, the comparison voltage between voltages Vh1 and Vh2 in the voltage comparator 11 is selected hysteretically in response to abrupt fluctuations in detection signals outputted from the wave detector 2. Therefore, it is possible to rapidly shift the operation to the ordinary operation after the detection signals are stabilized.

As explained above in the first and second embodiments, the system for selecting a cut-off frequency of the second AGC filter has the possibility that a circuit state largely changes depending on a selecting operation and the circuit is badly affected thereby. For example, assuming that a constant amount of current I is always flowing from an output terminal of the second AGC filter to the voltage-controlled amplifier 1 in FIG. 1, when a small resistor is switched to a large resistor, the current I flows also to the resistor. Therefore, a voltage drop increases, and an output voltage from the AGC filter drops. Namely, the voltage in the AGC filter fluctuates through selection of the resistor, and the fluctuation appears in a detection output, which causes degradation of the signal.

On the other hand, as described above in the third and fourth embodiments, the system, in which an electrical discharging speed of a capacitor in the first AGC filter is switched, may resultantly make an AGC speed slower.

To solve the problems, an AGC circuit based on a peak detection system according to a fifth embodiment of the present invention is configured by combining the first or second embodiment with the third or fourth embodiment, so that the defects described above are compensated by each other. Namely, fluctuations in output due to change in the circuit state are suppressed, and also excess of the AGC operation can be suppressed without the AGC speed to be extremely slow.

As explained above, the AGC circuit based on a peak detection system having two filters comprises a second voltage comparator which selects one of a first voltage and a second voltage as a comparison voltage based on the result of its comparison and compares the comparison voltage to a detection signal outputted from a wave detector. The AGC circuit also comprises a second filter which is located in the next stage from a first filter, selects a frequency based on the result of comparison of the second voltage comparator, and inputs the result obtained by subjecting the signal to low-pass filtering based on the cut-off frequency into a voltage-controlled amplifier as a control voltage. Thus, when a largely modulated signal is abruptly inputted, selection of a cut-off frequency of the second filter is performed so that the cut-off frequency becomes high, which allows an AGC control speed to be increased. Therefore, it is possible to obtain such advantageous effect that excess of the AGC operation can be suppressed.

Further, the comparison voltage between two voltages in the second voltage comparator is selected hysteretically in response to abrupt fluctuations in detection signals outputted from the wave detector. Therefore, it is possible to rapidly shift the operation to the ordinary operation after the detection signals are stabilized.

With another aspect of the present invention, an AGC circuit based on a peak detection system having two filters comprises a second voltage comparator which selects one of a first voltage and a second voltage as a comparison voltage based on the result of its comparison and compares the comparison voltage to a detection signal outputted from a wave detector The AGC circuit also comprises a first filter which is located in the upstream stage from a second filter, and increases or decreases an output voltage based on the result of comparison of a first voltage comparator as well as to the result of comparison of the second voltage comparator. Thus, when a largely modulated signal is abruptly inputted, by increasing or decreasing an output voltage from the first filter so that a speed of its changing decreases. Therefore, it is possible to obtain such an advantageous effect that excess of the AGC operation can be suppressed.

Further, the comparison voltage between two voltages in the second voltage comparator is selected hysteretically in response to abrupt fluctuations in detection signals outputted from the wave detector. Therefore, it is possible to obtain another advantageous effect that the operation can rapidly be shifted to the ordinary operation after the detection signals are stabilized.

Further, in both of the first and second aspects of the present invention, selection of a cut-off frequency of the second filter is performed through selection of a resistor. Thus, when a largely modulated signal is abruptly inputted, selection between resistors in the second filter so as to select a resistor having a resistance with a cut-off frequency to be high, which allows an AGC control speed to be increased. Therefore, it is possible to obtain such an advantageous effect that excess of the AGC operation can be suppressed.

Further, in both of the first and second aspects of the present invention, selection of a cut-off frequency of the second filter is performed through selection of a capacitor. Thus, when a largely modulated signal is abruptly inputted, selection between capacitors in the second filter is set so as to select a capacitor having a capacitance with a cut-off frequency to be high, which allows an AGC control speed to be increased. Therefore, it is possible to obtain such an advantageous effect that excess of the AGC operation which has been the problem can be suppressed.

Further, in both of the first and second aspects of the present invention, increasing or decreasing of an output voltage from the first filter is performed through selection of a constant current source. Thus, when a largely modulated signal is abruptly inputted, by setting selection between constant current sources in the first filter so as to select a constant current source having a driving current causing a speed of increasing or decreasing an output voltage to be lower. Therefore, it is possible to obtain such an advantageous effect that a second filter can sufficiently follow fluctuations in output voltages from the first AGC filter.

Further, in both of the first and second aspects of the present invention, increasing or decreasing of an output voltage from the first filter is performed through selection of a capacitor. Thus, when a largely modulated signal is abruptly inputted, by setting selection between capacitors in the first filter so as to select a capacitor having a capacitance causing a speed of increasing or decreasing an output voltage to be lower. Therefore, it is possible to obtain such an advantageous effect that a second filter can sufficiently follow fluctuations in output voltages from the first AGC filter.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An automatic gain control (AGC) circuit based on a peak detection system comprising:

a voltage-controlled amplifier having a gain varying in response to a control voltage and amplifying a modulated signal with the gain;

a wave detector detecting the modulated signal amplified by said voltage-controlled amplifier;

a first comparator comparing a detection signal output by said wave detector to a comparison voltage and outputting a first comparison signal;

a second comparator comparing the detection signal to one of a first voltage and a second voltage, and selecting one of the first voltage and the second voltage based on comparison of the one of the first and second voltage selected to the detection signal and outputting a second comparison signal;

a first filter receiving the first comparison signal and outputting an output signal having a voltage which increases or decreases based on the first comparison signal; and a second filter receiving the second comparison signal and selecting a cut-off frequency based on the second comparison signal and supplying the output signal, after low-pass filtering based on the cut-off frequency selected, to said voltage-controlled amplifier as the control voltage.

2. The AGC circuit based on a peak detection system according to claim 1, wherein said second filter has a plurality of resistors for determining the cut-off frequency, said second filter selecting one of said resistors based on the second comparison signal.

3. The AGC circuit based on a peak detection system according to claim 1, wherein said second filter has a plurality of capacitors for determining the cut-off frequency, said second filter selecting one of said capacitors based on the second comparison signal.

4. The AGC circuit based on a peak detection system according to claim 1, wherein said first filter has a plurality of current sources for determining speed of change of the voltage which increases or decreases, said first filter selecting one of said current sources based on the second comparison signal.

5. The AGC circuit based on a peak detection system according to claim 1, wherein said first filter has a plurality of capacitors for determining speed of change of the voltage which increases or decreases, said first filter selecting one of said capacitor sources based on the second comparison signal.

6. An automatic gain control (AGC) circuit based on a peak detection system comprising:

a voltage-controlled amplifier having a gain varying in response to a control voltage and amplifying a modulated signal with the gain;

a wave detector detecting the modulated signal amplified by said voltage-controlled amplifier;

a first comparator comparing a detection signal output by said wave detector to a comparison voltage and outputting a first comparison signal;

a second comparator comparing the detection signal to one of a first voltage and a second voltage, and selecting one of the first voltage and the second voltage based on comparison of the one of the first and second voltage selected to the detection signal and outputting a second comparison signal;

a first filter receiving the first and second comparison signals and outputting an output signal having a voltage which increases or decreases based on the first comparison signal and on the second comparison signal; and a second filter receiving a signal obtained by low-pass filtering a signal output from said first filter, at a cut-off frequency, and producing a signal output to said voltage-controlled amplifier as the control voltage.

7. The AGC circuit based on a peak detection system according to claim 6, wherein said second filter has a plurality of resistors for determining the cut-off frequency, said second filter selecting one of said resistors based on the second comparison signal.

8. The AGC circuit based on a peak detection system according to claim 6, wherein said second filter has a plurality of capacitors for determining the cut-off frequency, said second filter selecting one of said capacitors based on the second comparison signal.

9. The AGC circuit based on a peak detection system according to claim 6, wherein said first filter has a plurality of current sources for determining speed of change of the voltage which increases or decreases, said first filter selecting one of said current sources based on the second comparison signal.

10. The AGC circuit based on a peak detection system according to claim 6, wherein said first filter has a plurality of capacitors for determining speed of change of the voltage which increases or decreases, said first filter selecting one of said capacitor sources based on the second comparison signal.

* * * * *